United States Patent [19]

Griffis

[11] 4,254,447
[45] Mar. 3, 1981

[54] INTEGRATED CIRCUIT HEAT DISSIPATOR

[75] Inventor: Patrick D. Griffis, Indianapolis, Ind.

[73] Assignee: RCA Corporation, New York, N.Y.

[21] Appl. No.: 28,875

[22] Filed: Apr. 10, 1979

[51] Int. Cl.$^3$ ............................................. H05K 7/20
[52] U.S. Cl. ................................... 361/386; 361/389; 174/16 HS
[58] Field of Search .................................. 357/81, 82; 361/386–389; 165/80 B, 80 D, 185; 174/16 HS, 52 FP

[56] References Cited

U.S. PATENT DOCUMENTS

| 3,208,511 | 9/1965 | McAdam | 174/16 HS |
| 3,222,580 | 12/1965 | Curll, Jr. | 165/80 B |
| 3,519,889 | 7/1970 | Monaco | 174/16 HS |
| 4,012,769 | 3/1977 | Edwards | 165/80 B |
| 4,054,901 | 10/1977 | Edwards | 357/81 |

FOREIGN PATENT DOCUMENTS

| 2425723 | 12/1975 | Fed. Rep. of Germany | 174/16 HS |
| 911445 | 11/1962 | United Kingdom | 174/16 HS |

Primary Examiner—Gerald P. Tolin
Attorney, Agent, or Firm—Eugene M. Whitacre; William H. Meagher; W. Brinton Yorks, Jr.

[57] ABSTRACT

An integrated circuit heat dissipator is provided which will additionally hold the integrated circuit in a printed circuit board prior to soldering. The heat dissipator is comprised of a single elastic piece of metallic material having oppositely facing sides joined by a fold at the top. A tab is located at the bottom of each of the sides which is suitable for insertion into a printed circuit board. The tabs have a width which allows them to contact only the heat-conducting pins of the integrated circuit. The heat dissipator is mounted adjacent to the integrated circuit with one of the tabs contacting the heat-conducting pins. The elastic material gives the heat dissipator a spring-like property which causes the tabs to press outwardly from each other when inserted in a board so as to fixedly hold the heat dissipator and the integrated circuit in the printed circuit board prior to soldering.

12 Claims, 7 Drawing Figures

INTEGRATED CIRCUIT HEAT DISSIPATOR

This invention relates to heat dissipators for electronic components and, in particular, to a heat dissipator advantageously used with integrated circuits.

Miniaturization of electronic circuits is made possible today largely through the use of integrated circuits, in which a large number of electronic devices are manufactured and connected on a small monolithic integrated circuit chip. The high concentration of electronic devices on the chip necessarily confines the power consumption of the devices to a relatively small area. The consumption of this power by electronic devices results in the generation of a substantial amount of heat which must be dissipated away from the circuits as they operate. In the instances of power amplifiers and regulators, which are now being manufactured in integrated circuit form, the heat generated by these circuits must be dissipated rapidly and efficiently to prevent abnormal operation of the circuits and possible destruction due to overheating. This necessity has led to the use of heat dissipators in conjunction with high power integrated circuits, which facilitate the transfer of heat energy away from the integrated circuit package during its operation.

Integrated circuits may be produced in a variety of protective packages. A common package is the dual-in-line package, or DIP, in which the integrated circuit chip is encased in a rectangular box of dielectric material. Numerous metallic terminals, called pins, are located along each of the longest sides of the DIP package. Several of the pins are electrically connected to the integrated circuit chip inside the box, thereby permitting electrical connections to be made to the chip circuit. Others of the pins (usually those closest to the centrally located chip) are in physical contact with the metallic ground plane on the bottom of the chip and are used to conduct heat from the chip to the external environment. In order to heatsink the DIP circuit, a heat dissipator may be attached to the package so as to contact the heat-conducting pins and thereby conduct heat away from the integrated circuit chip.

In several power amplifier integrated circuit packages, the heat-conducting pins are not formed as separate pins, but are formed as a single piece of metal comprising a wing-tab heatsink extending outwardly from both sides of the DIP package, as described in U.S. Pat. No. 3,665,256. Power amplifiers such as the RCA CA810Q 7-Watt Audio Power Amplifier and CA1190GQ TV Sound IF and Audio Output Subsystems integrated circuits are manufactured with such wing-tabs, with the tabs bent downwardly for printed circuit board insertion. While the wing-tab heatsinks thus formed are sufficient to cool the integrated circuit during operation at room temperature, operation at unusually high ambient temperatures or under continuous high-power conditions may require additional heat-sinking to prevent damage to the integrated circuit. It is therefore desirable to use an additional heat dissipator which is both economically manufactured and easily mounted in conjunction with the wing-tab heatsink.

A heat dissipator is usually attached to an integrated circuit prior to mounting the integrated circuit in a printed circuit board and fixedly attaching the integrated circuit to the board such as by wave soldering. The integrated circuit is usually loosely inserted in the board and, with the added weight of the attached heat dissipator, the integrated circuit can readily fall or be vibrated out of the board prior to assembly line wave soldering. It is thus desirable for the heat dissipator and integrated circuit assembly to be fixedly held in position on the printed circuit board while awaiting its permanent mounting by soldering.

In accordance with the principles of the present invention, an integrated circuit heat dissipator is provided which will additionally hold the integrated circuit in a printed circuit board prior to soldering. The heat dissipator is comprised of a single elastic piece of metallic material having oppositely facing sides joined by a fold at the top. A tab is located at the bottom of each of the sides which is suitable for insertion into a printed circuit board. The tabs have a width which allows them to contact only the heat-conducting pins or wing-tabs of the DIP integrated circuit. The heat dissipator is mounted adjacent to the integrated circuit with one of the tabs contacting the heat-conducting pins. The elastic material gives the heat dissipator a spring-like property which causes the tabs to press outwardly from each other when inserted in a board so as to fixedly hold the heat dissipator and the integrated circuit in the printed circuit board prior to soldering.

In accordance with a further aspect of the present invention, the oppositely facing sides are folded inwardly to limit their compression during insertion so that the elastic limit of the metallic material will not be exceeded.

In accordance with yet another aspect of the present invention, a tab is formed in one of the oppositely facing sides and folded inwardly. During insertion, this tab limits the distance over which the oppositely facing sides may be compressed so that the elastic limit of the metallic material will not be exceeded.

Figure 1:
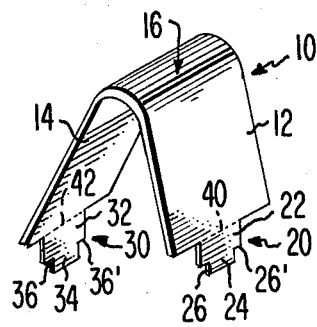
FIG. 1 is a perspective view of a heat dissipator constructed in accordance with the principles of the present invention.

Referring to FIG. 1, a heat dissipator 10 is shown. Heat dissipator 10 is comprised of a single stamped piece of elastic metallic material folded at the top to form a general A-shape. When folded as indicated at 16, the dissipator has two oppositely facing sides 12 and 14. Extending from the bottom edges of the sides 12 and 14 are respective tabs 20 and 30. The tabs 20 and 30 are folded as indicated by broken lines 40 and 42 at the bottom of the sides so that the tabs are in substantially parallel alignment. This alignment permits the tabs to be easily inserted into slots in a printed circuit board. The tabs are formed in two sections: thermal contact sections 22 and 32 and insertion sections 24 and 34. The thermal contact sections 22 and 32 have a width which is greater than the width of the insertion sections 24 and 34 such that shoulders 26, 26' and 36, 36' are formed at the lower corners of the thermal contact sections 24 and 34, respectively.

Figure 2:
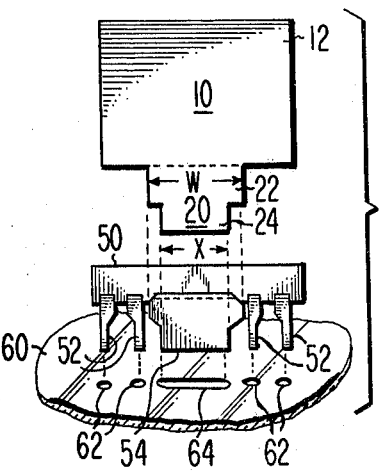
FIG. 2 is an exploded view of the heat dissipator of FIG. 1 in operative engagement with a DIP packaged integrated circuit and a printed circuit board.

FIG. 2 shows an exploded view of the heat dissipator of FIG. 1 in operative engagement with a DIP packaged integrated circuit. The thermal contact section of the tab 22 is seen to have a width W. The width X of the insertion section 24 of the tab 20 is less than the width W. An integrated circuit chip is encapsulated in a body of dielectric material 50. Extending from each of the longest sides of the body are a number of metallic leads 52. The leads 52 are internally connected to the integrated circuit chip and provide means for connecting power and signal paths to the chip. Extending from the center of the longest sides of the body is a wing-tab heat conductor 54, one end of which is shown in the FIGURE. The integrated circuit chip is mounted on the wing-tab heat conductor in the center of the body so that the conductor 54 will efficiently conduct heat generated in the chip to the external environment of the package. The upper portion of the wing-tab heat conductor 54 has a width W and the lower portion has a narrower width X.

The DIP package of FIG. 2 is mounted on a circuit board 60 by inserting leads 52 into separate holes 62 in the board, and the two ends of conductor 54 into slots 64 with lengths slightly larger than the dimension X of the lower portion of the conductor. The heat dissipator 10 is mounted on the board with tab 20 being in contact with conductor 54. The tab 20 is inserted into the common slot 64 with one end of conductor 54. The other tab 30 is inserted into a separate slot in the board (not shown), which is generally parallel to but spaced apart from the slot 64 occupied by tab 20 and conductor 54. The slots are spaced apart by a distance which is less than the normal distance between the two tabs. In order to insert the tabs 20 and 30, it is necessary to compress the opposite sides 12 and 14 inwardly. When the heat dissipator is compressed, inserted into the slots and released, the elastic material of the dissipator causes the tabs to spring outward from each other in opposite directions along the plane of the printed circuit board. The force of this springing action is sufficient to press the tab 20 firmly into contact with the conductor 54, and the tab 30 against the side of its slot in the board, thereby holding both the heat dissipator and the integrated circuit on the board prior to soldering.

When mounted as described herein, the thermal contact section 22 of the tab 20 is firmly in contact with the upper portion of the conductor 54. The insertion section 24 of the tab 20 is in contact with the lower portion of the conductor 54. This firm contact ensures good heat conductivity between the conductor 54 and the tab 20. The good conductivity is made permanent after soldering, at which time the insertion portion of the tab 20 is soldered to the lower portion of the conductor 54.

The width W of the thermal contact section 22 of the tab 20 is chosen to be substantially equal to the width W of the upper portion of the heat conductor 54. This provides a maximum contact area between the conductor and tab without the possibility of the tab 20 contacting either of the leads 52 located on either side of the conductor 54. The length and width of sides 12 and 14 of the dissipator are chosen to have an area suitable for dissipating the required amount of heat from the integrated circuit. If desired, flaps can be cut and folded outwardly from the sides 12 and 14 to provide additional cooling of the dissipator by convection.

Figure 3:
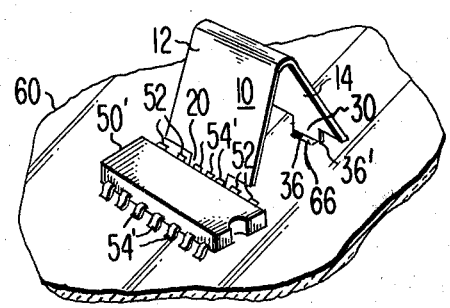
FIG. 3 is a perspective view of the heat dissipator of FIG. 1 in operative engagement with a DIP packaged integrated circuit.

A perspective view of an operatively engaged integrated circuit 50' and heat dissipator 10 is shown in FIG. 3. Instead of a wing-tab heat conductor 54, the integrated circuit 50' has three individual heat-conducting leads 54' extending from each of the longest sides of the integrated circuit. The tab 20 is seen to be firmly in contact with the heat-conducting leads 54' and the tab 30 is inserted into a slot 66 in the printed circuit board 60. The shoulders 26, 26' (not shown) and 36, 36' are in contact with the surface of the board 60 and limit the depth of insertion of the tabs 20 and 30 in the board. By so limiting the insertion depth of the dissipator, the side 12 is prevented from contacting the signal and power leads 52 which would short these leads to each other or to ground.

Figure 4:
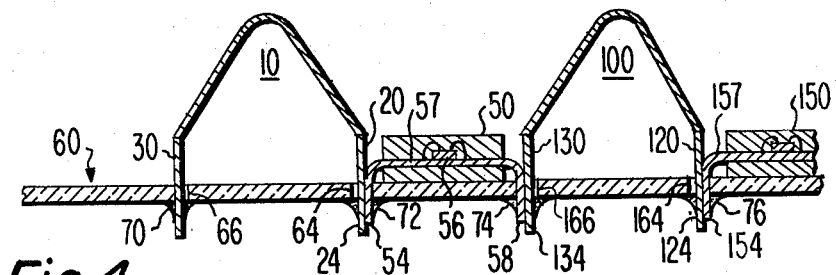
FIG. 4 is a fragmented cross-sectional view of two heat dissipators constructed in accordance with the principles of the present invention and in operative engagement with two DIP packaged integrated circuits.

The heat dissipator of the present invention may be advantageously used to heatsink two integrated circuits simultaneously, as shown in the cross-sectional representation of FIG. 4. Two integrated circuits 50 and 150 are illustratively mounted on a printed circuit board 60 and are heatsinked by dissipators 10 and 100. Integrated circuit 50 contains an integrated circuit chip 56 which is mounted on a heat conductor 57. The ends 54 and 58 of conductor 57 are bent in an L-shape and inserted through slots 64 and 166 in the board 60. Integrated circuit 150 similarly has a heat conductor 157, an end 154 of which is bent and inserted through a slot 164. A heat dissipator 10 is mounted adjacent to one side of the integrated circuit 50, with a tab 30 inserted into a slot 66 and a tab 20 inserted into slot 64 alongside the end 54 of conductor 57. The shoulders of the tabs limit the insertion depths of the tabs in the printed circuit board. Tab 30 is soldered to a layer of metallic foil on the underside of the printed circuit board as shown at 70. Similarly, the insertion section 24 of the tab 20 is soldered to the end 54 of conductor 57, and to the foil layer, as shown at 72.

A second heat dissipator 100 is mounted intermediate integrated circuits 50 and 150. Dissipator 100 has tabs 130 and 120 which are inserted through slots 166 and 164 in the printed circuit board to the depth of the shoulders on the tabs. Tabs 130 and 120 are in contact with heat conductor ends 58 and 154, respectively, thereby holding both integrated circuits and the dissipator firmly in place prior to soldering by virtue of the spring force of the dissipator. Insertion sections 134 and 124 of the tabs are then soldered to the heat conductor ends 58 and 154 and to the foil layer as shown at 74 and 76. Heat dissipator 100 thus dissipates heat from both integrated circuits 50 and 150.

Various modifications of FIG. 4 may also be employed to ensure adequate heatsinking of the integrated circuits. For example, if only integrated circuit 50 is present and integrated circuit 150 is omitted, the two heat dissipators 10 and 100 will provide heat dissipation on both sides of the integrated circuit 50. This arrangement provides maximum cooling of the integrated circuit 50. Likewise, a third heat dissipator (not shown) may be mounted on the opposite side of integrated circuit 150 from that of heat dissipator 100. With this arrangement, heat dissipator 10 and the third heat dissipator dissipate heat from integrated circuits 50 and 150, respectively, and heat dissipator 100 dissipates heat from both integrated circuits.

As mentioned previously, it is necessary to compress the opposite sides of the dissipators of FIGS. 1–4 prior to insertion into the printed circuit board. The elastic metallic dissipator will then spring back after insertion to hold the dissipator and the integrated circuit package in position in the board. However, it is possible for the dissipator to be overcompressed beyond the elastic limit of the metallic material. Such overcompression will cause the dissipator to lose its spring-like property after insertion, which can result in the dissipator and integrated circuit becoming easily dislodged from the board.

Figures 5, 6:
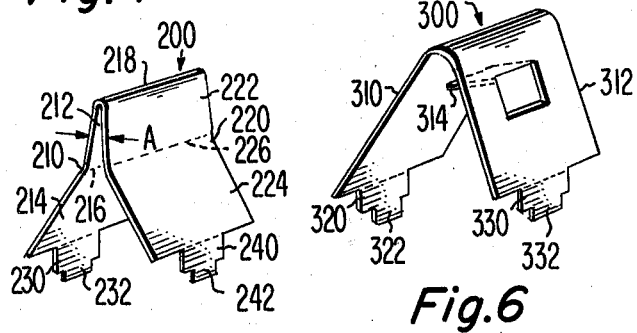
FIG. 5 is a perspective view of another heat dissipator having inwardly folded opposite sides, constructed in accordance with the principles of the present invention.
FIG. 6 is a perspective view of a further heat dissipator constructed in accordance with the principles of the present invention and having an inwardly folded flap.

This problem is prevented by the embodiment of the invention shown in FIG. 5. A dissipator 200 is there shown, having oppositely facing sides 210 and 220 joined at a fold 218. Extending from the bottom of the sides are tabs having thermal contact sections 230 and 240 and insertion sections 232 and 242. The two tabs are folded at their juncture with the sides 210 and 220 so that they are located in substantially parallel planes to facilitate their insertion into a printed circuit board.

The opposite sides 210 and 220 are not flat as in the previous embodiments, but are folded inwardly as shown at broken lines 216 and 226 to form upper and lower sections 212, 222 and 214, 224, respectively. The upper sections 212 and 222 are thus separated by a small distance A. When the dissipator 200 is compressed by pinching the upper sections 212 and 222 toward each other, the compression distance is limited to the distance A. When the overcompression distance of the dissipator is, as in this example, greater than A, it can be seen that the slightly separated sections 212 and 222 prevent the dissipator from being overcompressed beyond its elastic limit.

A further embodiment of the present invention, which also inhibits damage due to overcompression, is illustrated in FIG. 6. The heat dissipator 300 there shown includes oppositely facing sides 310 and 312 and tabs including thermal contact sections 320 and 330 and insertion sections 322 and 332. A slot is cut in side 312 to form a flap 314 which is folded inward toward the side 310. When the dissipator 300 is compressed for insertion into a printed circuit board, the flap 314 can contact the opposite side 310, thereby limiting the compression distance of the dissipator.

Figure 7:
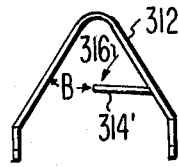
FIG. 7 is an end view of another heat dissipator constructed in accordance with the principles of the present invention and having an inwardly folded flap.

This operation is further illuminated in the embodiment of FIG. 7, which differs from that of FIG. 6 in that a flap 314′ is folded downwardly and inwardly from side 312, as indicated by arrow 316. The compression distance of the dissipator is seen to be limited to the distance B between the opposite side 310 and the end of flap 314′. In addition to performing as a compression limiter, the flaps 314 and 314′ result in increased convective heat dissipation by the heat dissipator.

What is claimed is:

1. A thermally protected integrated circuit chip and printed circuit board mounting arrangement comprising:
    a perforated printed circuit board;
    an integrated circuit package enclosing said integrated circuit chip, mounted on said printed circuit board, and including a heat conductor extending from said enclosure and inserted into a first perforation in said printed circuit board; and
    a metallic heat dissipator mounted on said printed circuit board adjacent to said integrated circuit package and including two oppositely facing sides joined by a fold at the upper end of said dissipator, said fold, said sides and a portion of said printed circuit board defining an air space therebetween which is exclusive of said integrated circuit package, and first and second tabs extending from the lower ends of said sides, one of said tabs being inserted into said first perforation so as to be in contact with said heat conductor, and the other of said tabs being inserted into a second perforation spaced apart from, and located in a plane substantially parallel to, that of said first perforation,
    wherein said tabs exert an opposing spring force with respect to each other so that said one tab forcibly contacts said heat conductor within said first perforation, thereby retaining said heat dissipator and said integrated circuit package on said printed circuit board.

2. The mounting arrangement of claim 1, wherein said integrated circuit package comprises a rectangular molded body having a plurality of leads and said heat conductor extending from the longest sides of said body, which are bent so as to be suitable for insertion in perforations in said printed circuit board, said heat conductor having leads adjacent to it along the sides of said body, and
    said tabs are each comprised of a first section connected to one of said oppositely facing sides and having a given width which is substantially equal to the width of said integrated circuit heat conductor, and a second section connected to the end of said first section remote from said oppositely facing side and having a width which is less than said given width.

3. The mounting arrangement of claim 2, wherein said heat conductor has a given width and said leads located immediately adjacent on both sides of said conductor are separated by a given distance which is greater than said given width, and
    said first sections each have a width which is greater than said given width and less than said given distance; and
    said second sections each have a width which is substantially equal to said given width; and
    said first and second perforations have a length which is substantially equal to said given width.

4. The mounting arrangement of claim 2, or 3, wherein said heat conductor is comprised of a plurality of adjacent conductors each having a shape similar to that of said leads.

5. The mounting arrangement of claim 1, wherein said tabs are separated by a distance prior to insertion in said printed circuit board which is greater than the distance between said first and second perforation.

6. The mounting arrangement of claim 1, wherein said first and second tabs are folded at their junctions with said oppositely facing sides so as to be located in substantially parallel planes which are substantially perpendicular to the plane of said printed circuit board.

7. A thermally protected integrated circuit chip comprising:
    a perforated printed circuit board;
    an integrated circuit package enclosing said integrated circuit chip, mounted on said printed circuit board, and including a heat conductor having opposite ends extending from said enclosure and inserted into first and second perforations in said printed circuit board;

a first metallic heat dissipator mounted on said printed circuit board on one side of said integrated circuit package and including two oppositely facing sides joined by a fold at the upper end of said dissipator, and first and second tabs extending from the lower ends of said sides, said first tab being inserted into said first perforation so as to be in contact with one of the ends of said heat conductor, and said second tab being inserted into a third perforation spaced apart from said first perforation; and a second metallic heat dissipator mounted on said printed circuit board on the other side of said integrated circuit package with respect to said first metallic heat dissipator, and including two oppositely facing sides joined by a fold at the upper end of said dissipator, and first and second tabs extending from the lower ends of said sides, said first tab being inserted into said second perforation so as to be in contact with the other of said ends of said heat conductor, and said second tab being inserted into a fourth perforation spaced apart from said second perforation.

8. The mounting arrangement of claim 1, wherein said integrated circuit package further includes a plurality of non heat-conducting leads, and said heat dissipator comprises:

a rectangular metallic body folded at the center to form two oppositely facing sides; and first and second tabs formed at the respective ends of said oppositely facing sides and having widths suitable for contacting said heat conductor to the exclusion of said non heat-conducting leads of said integrated circuit package when the dissipator is mounted alongside said package.

9. The mounting arrangement of claim 1, wherein said integrated circuit package further includes a plurality of non heat-conducting leads, and said heat dissipator comprises:

a rectangular metallic body folded at the center to form two oppositely facing sides, having respective ends, said sides being folded inwardly intermediate said first fold and said ends such that the relative angle defined by said sides is smaller between said first and second folds than between said second folds and said ends; and first and second tabs formed at the respective ends of said oppositely facing sides and having widths suitable for contacting said heat conductor of said integrated circuit package to the exclusion of said non heat-conducting leads when the dissipator is mounted alongside said package.

10. The mounting arrangement of claim 1, wherein said integrated circuit package further includes a plurality of non heat-conducting leads, and said heat dissipator comprises:

a rectangular metallic body folded at the center to form two oppositely facing sides having respective ends;

a flap cut from one of said sides and folded inwardly from said one side toward the other of said sides; and first and second tabs formed at the respective ends of said oppositely facing sides and having widths suitable for contacting said heat conductor of said integrated circuit package to the exclusion of said non heat-conducting leads when the dissipator is mounted alongside said package.

11. The mounting arrangement of claims 8, 9, or 10, wherein said first and second tabs each comprise a first section connected to one of said ends and having a given width substantially equal to the width of said heat conductor, and a second section coupled to the end of said first section remote from the end of said side and having a width which is less than said given width.

12. The mounting arrangement of claims 8, 9, or 10, wherein said first and second tabs are folded at their junctions with said sides so as to be located in substantially parallel planes with respect to each other.

* * * * *